United States Patent
Knaipp et al.

(10) Patent No.: US 7,888,234 B2
(45) Date of Patent: Feb. 15, 2011

(54) METHOD FOR MANUFACTURING A SEMICONDUCTOR BODY WITH A TRENCH AND SEMICONDUCTOR BODY WITH A TRENCH

(75) Inventors: Martin Knaipp, Unterpremstätten (AT); Bernhard Löffler, Gleisdorf (AT)

(73) Assignee: austriamicrosystems AG, Unterpremstatten (AT)

( * ) Notice: Subject to any disclaimer, the term of this patent is extended or adjusted under 35 U.S.C. 154(b) by 247 days.

(21) Appl. No.: 12/148,446

(22) Filed: Apr. 17, 2008

(65) Prior Publication Data
US 2008/0290445 A1    Nov. 27, 2008

(30) Foreign Application Priority Data
Apr. 17, 2007    (DE)    ........................ 10 2007 018 098

(51) Int. Cl.
H01L 21/76    (2006.01)
(52) U.S. Cl. .................... 438/448; 438/297; 438/700; 438/432; 257/506; 257/E21.54; 257/E29.001
(58) Field of Classification Search ................. 257/118, 257/244, 328–333, 466, 500–513, 594
See application file for complete search history.

(56) References Cited

U.S. PATENT DOCUMENTS

| 5,217,920 | A | 6/1993 | Mattox et al. |
| 5,436,190 | A | 7/1995 | Yang et al. |
| 5,877,067 | A | 3/1999 | Kimura et al. |
| 6,277,708 | B1 | 8/2001 | Bothra et al. |
| 2005/0142775 | A1* | 6/2005 | Koh ........................... 438/296 |
| 2005/0212026 | A1* | 9/2005 | Chung et al. ................. 257/301 |
| 2006/0261444 | A1 | 11/2006 | Grivna et al. |

FOREIGN PATENT DOCUMENTS

| EP | 0 221 394 | 10/1986 |
| WO | WO 00/13208 | 3/2000 |

OTHER PUBLICATIONS

Tan et al, Modeling and Simulation of the DRIE (Deep Reactive Ion Etch) Process ( published Oct. 20, 2006).*
"Modeling and Simulation of DRIE (Deep Reactive Ion Etch) Process", by Yunxia Guo et al., published at http://www.paper.edu.cn/download_feature_paper.php?serial_number=Agilentgs2007B003.

* cited by examiner

Primary Examiner—N. Drew Richards
Assistant Examiner—Mamadou Diallo
(74) Attorney, Agent, or Firm—Cohen Pontani Lieberman & Pavane LLP

(57) ABSTRACT

A method for manufacturing a semiconductor body with a trench comprises the steps of etching the trench (11) in the semiconductor body (10) and forming a silicon oxide layer (12) on at least one side wall (14) of the trench (11) and on the bottom (15) of the trench (11) by means of thermal oxidation. Furthermore, the silicon oxide layer (12) on the bottom (15) of the trench (11) is removed and the trench (11) is filled with polysilicon that forms a polysilicon body (13).

15 Claims, 9 Drawing Sheets

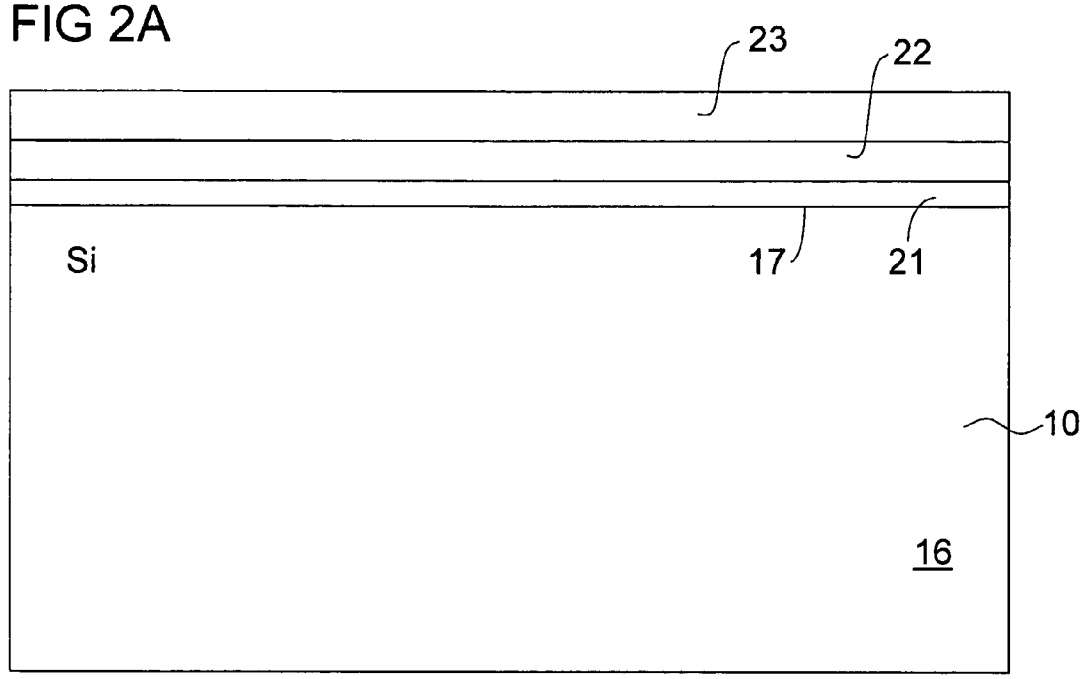
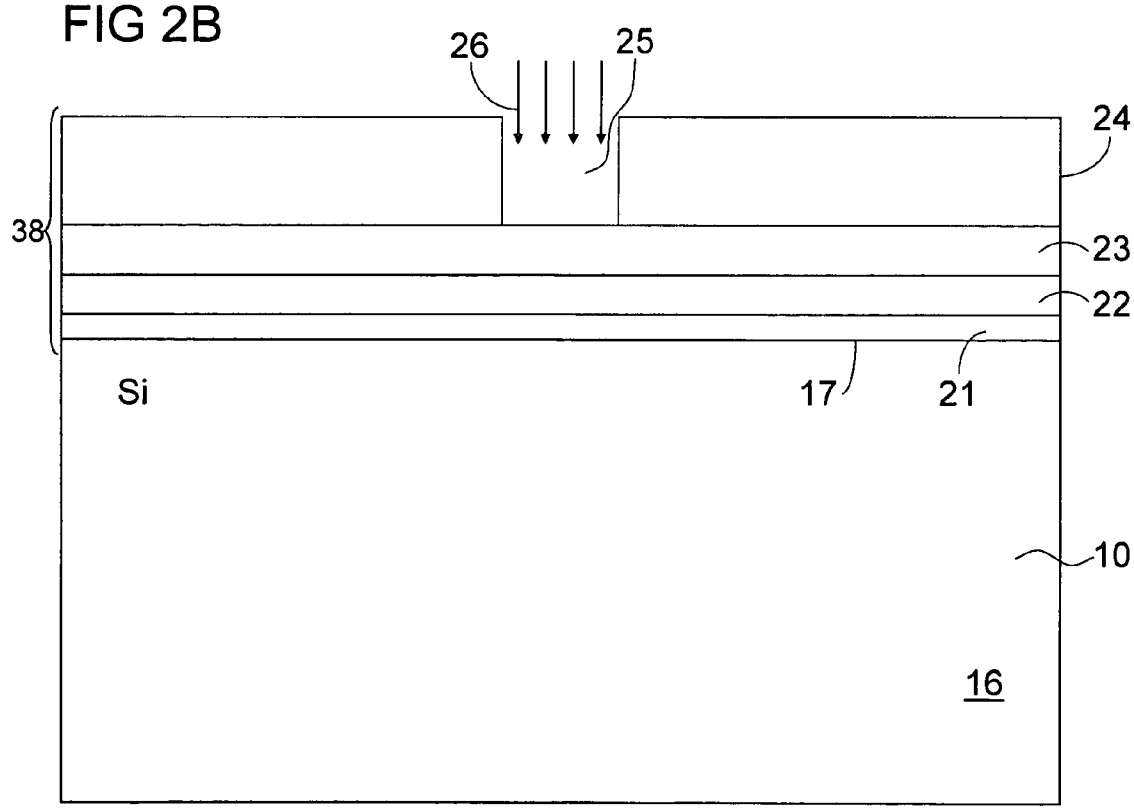

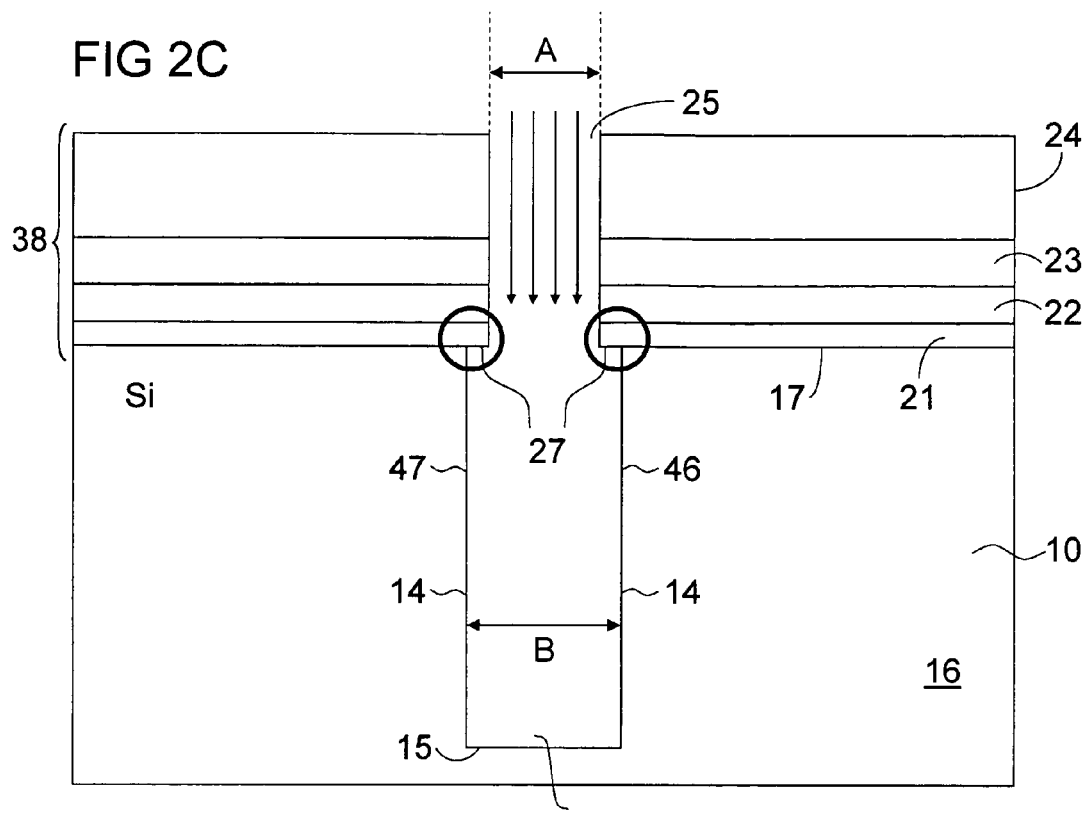
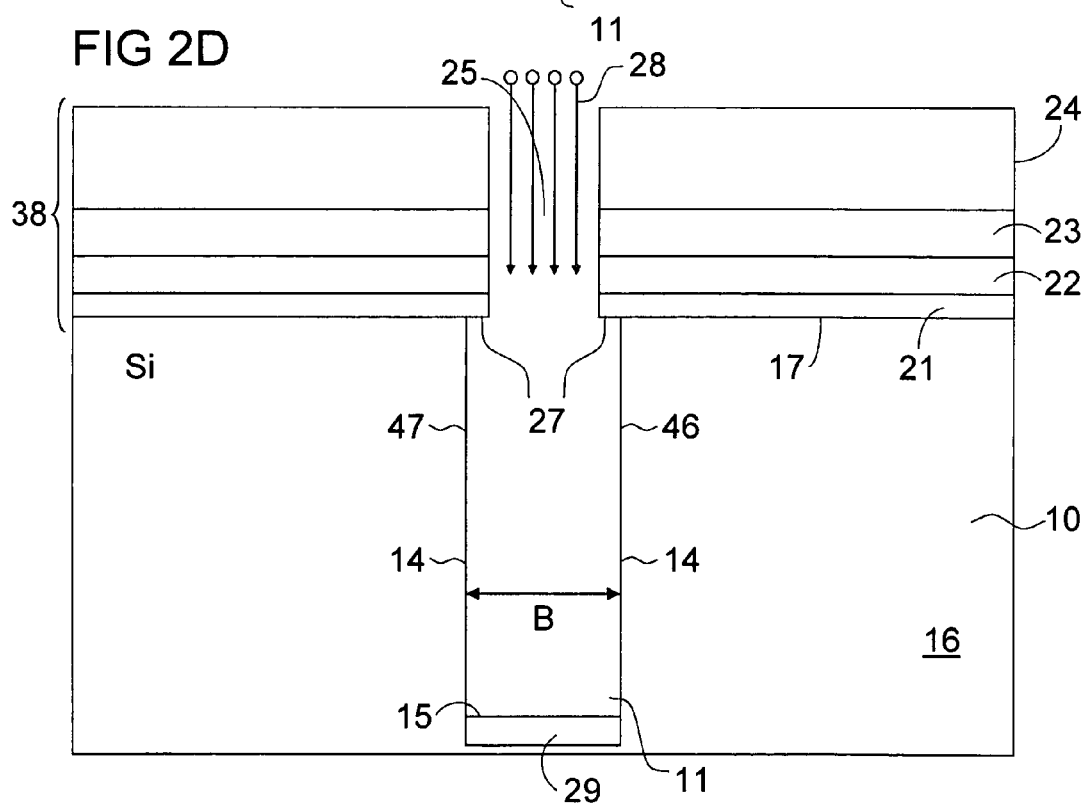

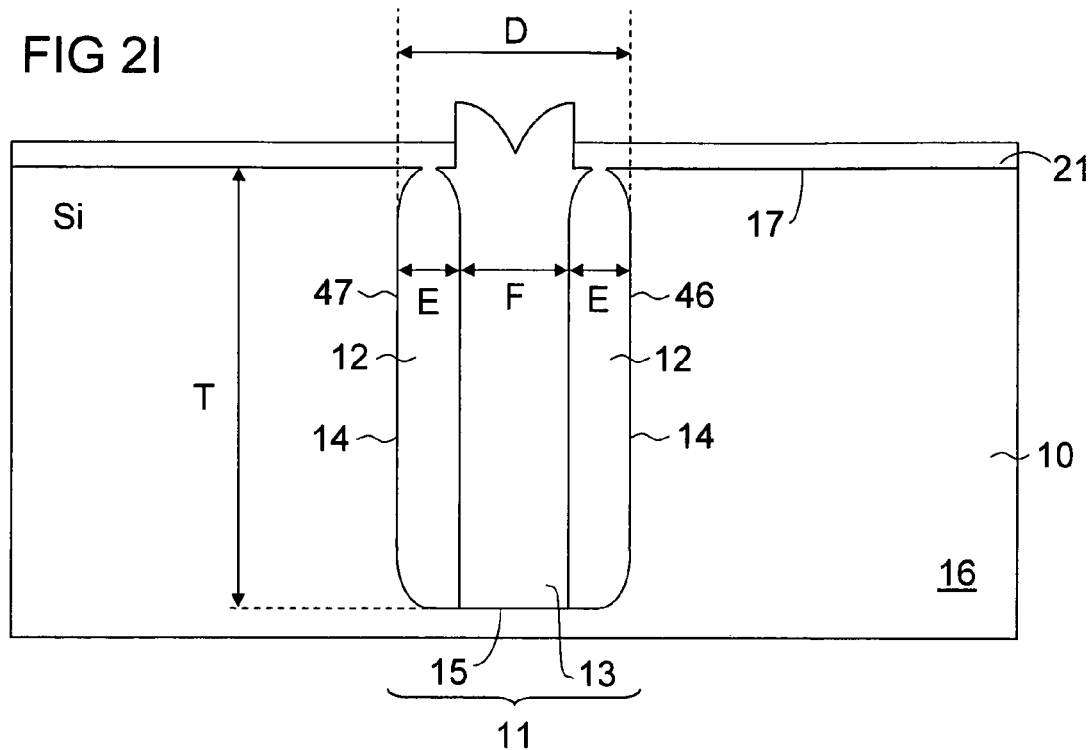
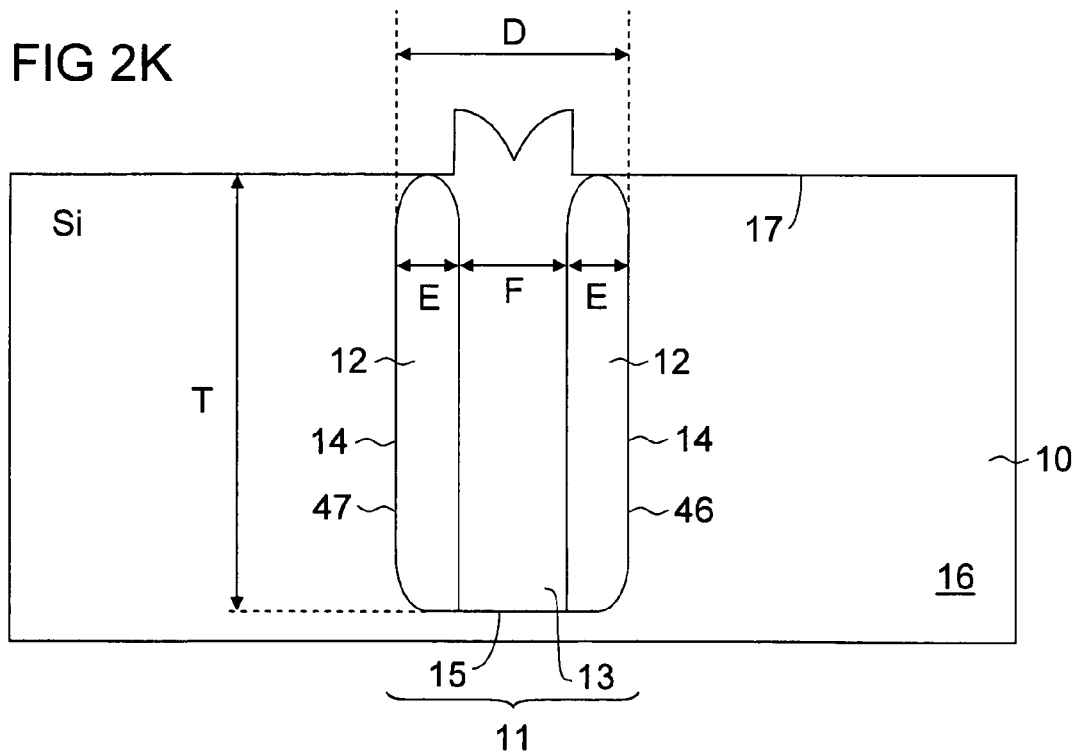

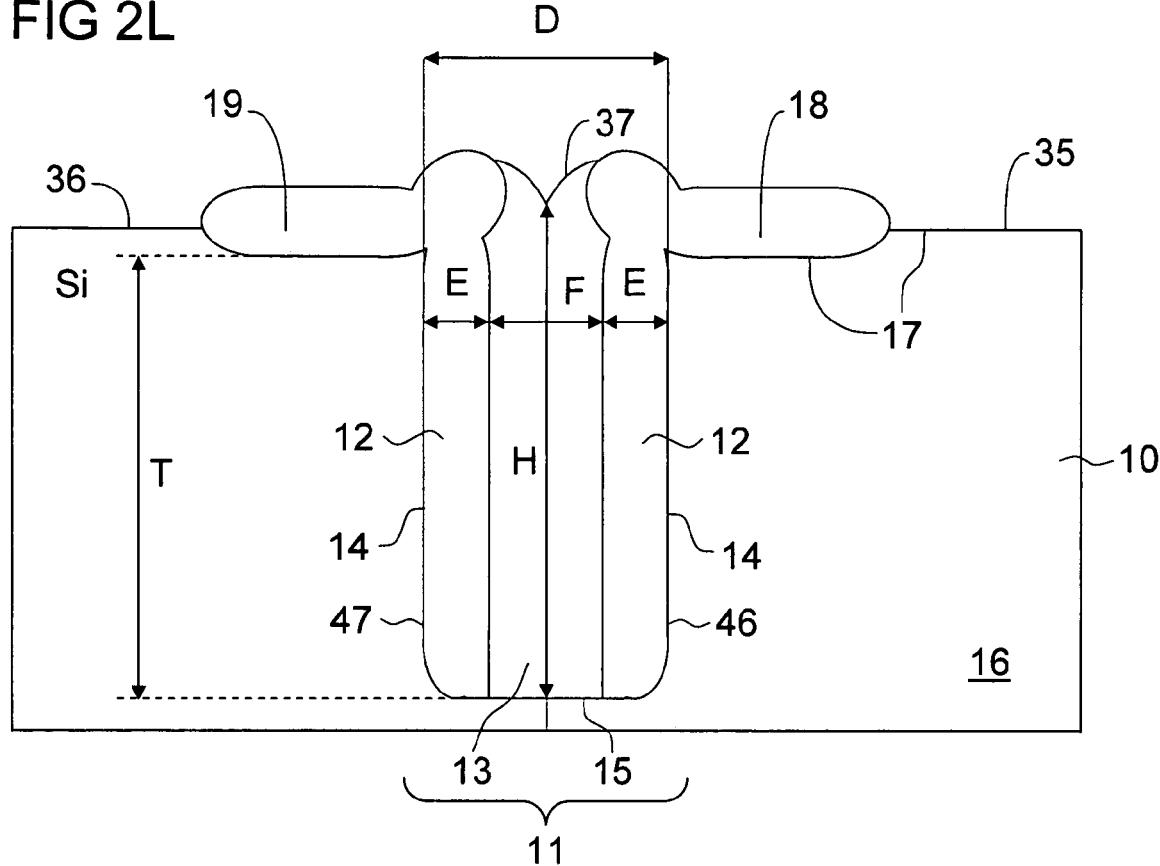

METHOD FOR MANUFACTURING A SEMICONDUCTOR BODY WITH A TRENCH AND SEMICONDUCTOR BODY WITH A TRENCH

RELATED APPLICATIONS

This application claims the priority of German patent application no. 10 2007 018 098.7 filed Apr. 17, 2007.

FIELD OF THE INVENTION

The present invention pertains to a semiconductor body with a trench and a method for its manufacture.

BACKGROUND OF THE INVENTION

A trench in a semiconductor body is often filled with an insulating material and can serve to isolate two transistors. A trench with a side wall that is provided with an insulating layer and that is filled with a conductive material can be used for realizing a storage cell.

SUMMARY OF THE INVENTION

In one embodiment of a method for manufacturing a semiconductor body with a trench, the trench is etched in the semiconductor body and a silicon oxide layer is formed on at least one side wall of the trench and on the bottom of the trench. The silicon oxide layer is realized by means of thermal oxidation. In addition, the silicon oxide layer on the bottom of the trench is removed. The trench is also filled with polysilicon. The polysilicon in the trench forms a polysilicon body.

In comparison with a silicon oxide layer that is deposited by means of chemical vapor deposition, abbreviated CVD, an insulating layer of very high quality is advantageously arranged on the side wall of the trench by means of the thermally oxidized silicon oxide layer. The dielectric strength of the thermally oxidized silicon oxide layer is advantageously higher than the dielectric strength of a silicon oxide layer of the same thickness that is deposited by means of CVD. In this case, a boundary layer between the silicon oxide layer and the semiconductor body contains fewer impurities than a boundary layer between a silicon oxide layer deposited by means of CVD and a semiconductor body. An electric contact with the semiconductor body can be advantageously produced underneath the bottom of the trench by means of the polysilicon body since doped polysilicon is a conductive material. Standard semiconductor technology processing steps are advantageously utilized for the manufacture of the semiconductor body. A trench of this type therefore can be produced at low cost.

In one embodiment, the etching of the trench in the semiconductor body is realized by utilizing an etching mask arrangement that features a polysilicon layer. The thermal oxidation is not only used for producing the silicon oxide layer in the trench, but also for producing an additional silicon oxide layer from the polysilicon layer. An additional etching mask arrangement that comprises the additional silicon oxide layer is used for removing the silicon oxide layer on the bottom of the trench. Due to the oxidation of the polysilicon layer, a recess in the additional etching mask arrangement is advantageously smaller than a recess in the etching mask arrangement. The protection of the silicon oxide on the side wall is simplified with the additional silicon oxide layer that protrudes into the recess.

The polysilicon layer is partially or completely consumed during the thermal oxidation. The additional etching mask arrangement may either have the polysilicon layer in converted form only, namely in the form of an additional silicon oxide layer, or may comprise a non-oxidized portion of the polysilicon layer and the additional silicon oxide layer.

In one embodiment, the trench is filled with polysilicon in such a way that the polysilicon body being formed is arranged directly on the silicon oxide layer and on a substrate material of the bottom.

In one embodiment, the trench has a depth with a value of >5 μm. The depth of the trench preferably has a value of >10 μm. It is advantageous that a trench with such a depth can be very reliably lined with a thermally oxidized silicon oxide layer. The silicon oxide layer therefore may serve as a lining layer. Flaws in the silicon oxide layer can be advantageously prevented by means of the oxidation method.

In one embodiment, the etching mask arrangement that is used as a mask for etching the trench features a hard-mask oxide layer and/or a silicon nitride layer in addition to the polysilicon layer. The silicon nitride layer is referred to as nitride layer below. The etching mask arrangement may feature at least one layer of the group that comprises the hard-mask oxide layer and the silicon nitride layer. In addition, the etching mask arrangement may feature a photoresist.

The hard-mask oxide layer can be referred to as an etching mask oxide layer. The hard-mask oxide layer can also be referred to as an oxide layer.

In one embodiment, the additional etching mask arrangement comprises the hard-mask oxide layer and/or the silicon nitride layer in addition to the additional silicon oxide layer and, if applicable, the polysilicon layer.

The bottom features a region that only comprises a surface in the center of the bottom. Alternatively, the region may comprise the bottom up to the side wall. The bottom may be slightly curved and feature a transition region to the side wall of the trench.

In one embodiment, the polysilicon body and the semiconductor body form a pn-junction on the bottom of the trench. In an alternative embodiment, the junction between the polysilicon body and the bottom of the trench is realized in the form of a junction with ohmic conductivity. Consequently, the junction can be realized with low resistance. The polysilicon body may feature a pn-junction or a low-resistance junction with the region of the bottom.

In one embodiment, a semiconductor body comprises a trench with at least one side wall and one bottom. A thermally oxidized silicon oxide layer is arranged on the side wall. The semiconductor body features a polysilicon body that is arranged directly on a substrate material of the bottom. The polysilicon body is further arranged on the silicon oxide layer.

The polysilicon body is advantageously in contact with the semiconductor body underneath the bottom of the trench such that the substrate material of the semiconductor body can be electrically contacted underneath the trench. This type of contacting of the semiconductor body can be realized with standard semiconductor technology processes and therefore at low cost. The polysilicon body here may be in direct contact with the substrate material in the region of the bottom, i.e., on a surface in the center of the bottom, or on the bottom up to the side wall. The thermally oxidized silicon oxide layer ensures very good insulation of the trench side wall.

In one embodiment for manufacturing the semiconductor body, an etching mask arrangement featuring a polysilicon layer is used for etching the trench in the semiconductor body and an additional etching mask arrangement that features an additional silicon oxide layer produced from the polysilicon layer by means of thermal oxidation is used for removing the silicon oxide layer on the bottom of the trench.

In one embodiment, the semiconductor body features a first and a second transistor, as well as the trench. The trench is advantageously used to isolate the first transistor from the second transistor. This makes it possible to prevent the first transistor from being unintentionally influenced by the second transistor, for example, in the form of latching up. The first and/or the second transistor may respectively consist of a high-voltage transistor. The transistors may be realized in the form of metal-oxide semiconductor field-effect transistors.

BRIEF DESCRIPTION OF THE DRAWINGS

Several embodiments of the invention are illustrated in the figures and described below. Regions and structures that act or function identically are identified by the same reference symbols. If regions or structures have corresponding functions, their description is not repeated in the description of each of the following figures.

FIGS. 2A to 2I, 2K and 2L show an exemplary embodiment of a method, wherein said figures respectively show cross sections through a semiconductor body in different stages of the method.

DETAILED DESCRIPTION OF THE DRAWINGS

Figure 1A:
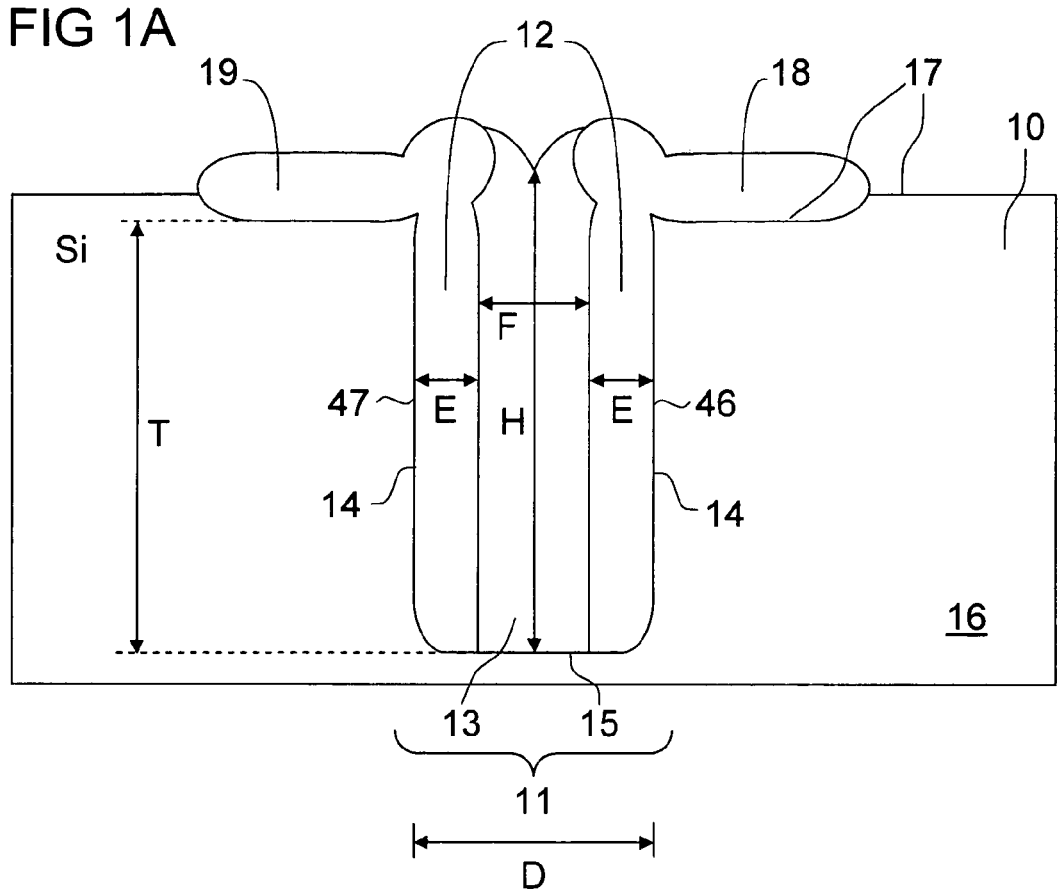
FIGS. 1A to 1C show exemplary embodiments of a semiconductor body with a trench.

FIG. 1A shows a cross section through an exemplary embodiment of a semiconductor body. The semiconductor body 10 features a trench 11, a thermally oxidized silicon oxide layer 12 and a polysilicon body 13. The trench 11 extends perpendicular to a first main surface 17 of the semiconductor body 10. The trench 11 comprises a side wall 14 and a bottom 15. The trench 11 extends from the first main surface 17 to the bottom 15 and is aligned orthogonally to the first main surface 17. The trench 11 has a depth T and a width D. In this case, the depth T corresponds to the distance between the bottom 15 and the first main surface 17. The first main surface 17 represents one of the boundaries of the substrate material 16.

The side wall 14 is arranged orthogonally to the first main surface 17. Furthermore, the side wall 14 extends from the first main surface 17 to the bottom 15. The side wall 14 is realized flat. The side wall 14 comprises a first surface 46 and a second surface 47 that are arranged approximately parallel to one another and extend from the first main surface 17 to the bottom 15. The first and the second surface 46, 47 are not curved. The bottom 15 has a slight curvature. However, the bottom 15 is essentially realized parallel to the first main surface 17. A transition from the side wall 14 to the bottom 15 is rounded.

The silicon oxide layer 12 is arranged on the side wall 14. Consequently, the silicon oxide layer 12 is in direct contact with a substrate material 16 of the semiconductor body 10 on the side wall 14. However, the silicon oxide layer 12 covers only part of the bottom 15. The substrate material 16 contains silicon. The silicon oxide layer 12 extends from the vicinity of the bottom 15 to the first main surface 17 of the semiconductor body 10. The silicon oxide layer 12 has a thickness E.

The polysilicon body 13 is arranged on the bottom 15 and directly borders the silicon oxide layer 12. Thus, the polysilicon body 13 is in direct contact with the substrate materials 16 of the semiconductor body 10 on the bottom 15 and therefore in electrical contact with the substrate material 16 of the semiconductor body 10 on the bottom 15. The polysilicon body 13 is in direct contact with the silicon oxide layer 12 in the vicinity of the side wall 14. The polysilicon body 13 is therefore in contact with the substrate material 15 on that side wall 14. The polysilicon body 13 has a height H perpendicular to the first main surface 17, where said height approximately corresponds to the depth T. The polysilicon body 13 therefore approximately extends from the bottom 15 to a plane that is formed by the first main surface 17.

The semiconductor body 10 furthermore features a first additional silicon oxide layer 18 and a second additional silicon oxide layer 19 that extend on the first main surface 17 to both sides of the trench 11 and transform into the silicon oxide layer 12. The first main surface 17 forms a boundary surface between the substrate material 16 and the first and the second additional silicon oxide layer 18, 19. A recess of the substrate material 16 has a width that corresponds to the width D of the trench. Furthermore, a recess in the silicon oxide layer 12 has a width F in a plane that lies parallel to the first main surface 17. The width F corresponds to the value of a dimension of the polysilicon body 13 in a plane that lies parallel to the first main surface 17.

Due to the electrical contact with the substrate material 16 on the bottom 15 of the trench 11, the polysilicon body 13 advantageously has a defined electrical potential that is not free floating. An electrically conductive contact between the plane of the first main surface 17 and the substrate material 16 on the bottom 15 can be advantageously produced by means of the polysilicon body 13. The polysilicon body 13 therefore can be used as an active element, for example, for collecting charge carriers injected into the substrate material 16.

In one embodiment, the height H of the polysilicon body 13 perpendicular to the first main surface 17 is greater than the depth T. The polysilicon body 13 extends beyond the first main surface 17 and can be electrically connected simply by means of a conductive layer arranged above the first main surface 17. In one preferred embodiment, the depth T is 16 μm. The depth T of the trench 11 preferably is at least five-times the value of the width D of the trench 11.

Figure 1B:
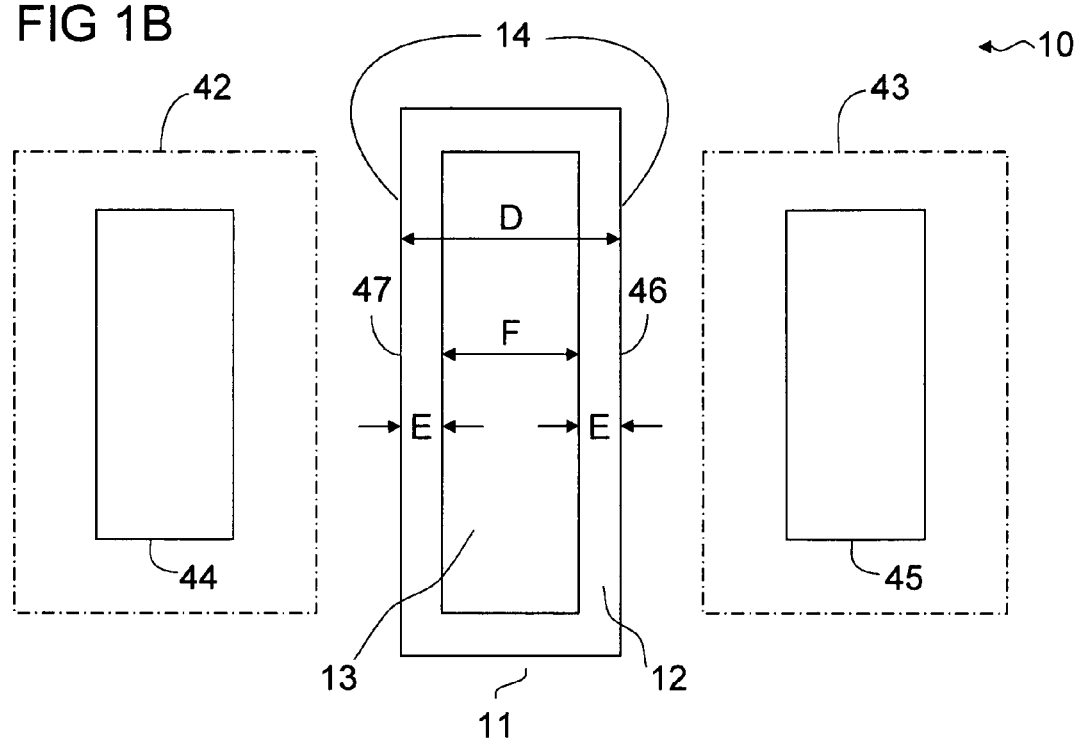

FIG. 1B shows an exemplary embodiment of a semiconductor body in the form of a horizontal projection. The semiconductor body 10 comprises a first region 42 with a first transistor 44 and a second region 43 with a second transistor 45. The trench 11 is realized in the form of a recess in the horizontal projection. The recess may have an elongated shape. The trench 11 features exactly one side wall, i.e., side wall 14. The first and the second surface 46, 47 of the side wall 14 are arranged parallel to one another. The trench 11 isolates the first region 42 from the second region 43 and therefore the first transistor 44 from the second transistor 45.

In a not-shown alternative embodiment, the trench 11 may serve as a sinker for connecting a region buried in the semiconductor body 10. The polysilicon body 13 is doped with phosphorus for this purpose.

Figure 1C:
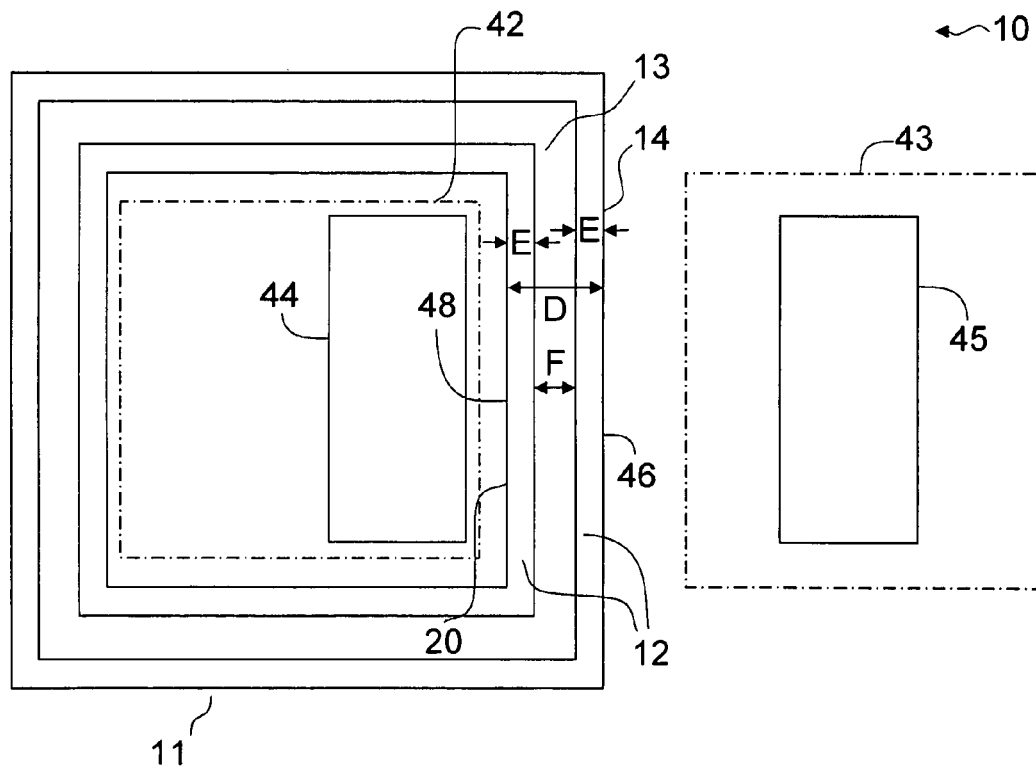

FIG. 1C shows another exemplary embodiment of a semiconductor body according to the proposed principle in the form of a horizontal projection. The trench 11 encloses the first region 42 with the first transistor 44. The trench 11 therefore surrounds the first region 42 on the main surface 17 of the semiconductor body 10. The first region 42 may have, for example, a rectangular or circular form. According to this embodiment, the trench 11 has two side walls: the side wall 14 and an additional side wall 20. The side wall 14 comprises the first surface 46. The additional side wall 20, in contrast, comprises a third surface 48. The first and the third surface 46, 48 are arranged parallel to one another. With the exception of the reference symbols used for the side wall or side walls, respectively, the exemplary detail of a cross section through the semiconductor body 10 shown in FIG. 1A therefore applies to both embodiments of a horizontal projection.

FIGS. 2A to 2K show an exemplary method for manufacturing a semiconductor body. These figures respectively show an exemplary cross section through the semiconductor body after different successive steps of the method.

FIG. 2A shows the semiconductor body 10 with the substrate material 16 after carrying out layer fabrication steps. A hard-mask oxide layer 21 is initially produced on the semiconductor body 10. The hard-mask oxide layer 21 is arranged on the first main surface 17 of the semiconductor body 10. The hard-mask oxide layer 21 is produced by means of thermal oxidation of the substrate material 16. The hard-mask oxide layer 21 comprises silicon oxide. A nitride layer 22 is deposited on the hard-mask oxide layer 21. A polysilicon layer 23 is then deposited on the nitride layer 22. The deposition of the nitride layer 22 and the polysilicon layer 23 is realized by means of a CVD method in each case.

In an alternative embodiment, the deposition of the nitride layer 22 can be omitted.

In an alternative embodiment, the hard-mask oxide layer 21 can be deposited.

FIG. 2B shows the semiconductor body 10 during an etching process. A photoresist 24 is deposited on the semiconductor body 10 according to FIG. 2A. The deposition is realized by means of a spin-coating process. The photoresist 24 is exposed and developed. The photoresist 24 features a recess 25. The recess 25 more or less defines the trench 11. An etching gas 26 is used on the polysilicon layer 23.

FIG. 2C shows the semiconductor body 10 with an etching mask arrangement 38 that comprises the hard-mask oxide layer 21, the nitride layer 22, the polysilicon layer 23 and the photoresist 24. The etching mask arrangement 38 features a recess 25 and is arranged above the first main surface 17 of the semiconductor body 10. In contrast to the semiconductor body 10 according to FIG. 2B, the polysilicon layer 23 underneath the recess 25 of the photoresist 24 is removed. An etching stop for etching the polysilicon layer 23 is defined by the underlying nitride layer 22. The nitride layer 22 underneath the recess 25 is subsequently removed. An etching stop for etching the nitride layer 22 is defined by the underlying hard-mask oxide layer 21. In this case, an etching stop is defined by the substrate material 16. The hard-mask oxide layer 21 is also removed. The trench 11 is then etched. An undercut 27 is produced during this process. In one embodiment, the undercut 27 has a value of more than 0.2 µm. The undercut may have a value, for example, of 0.3 µm. The hard-mask oxide layer 21 therefore is undercut. The trench 11 comprises a recess with a width B. Due to the undercut 27, the width B is greater than the width A of a recess of the etching mask arrangement 38. The trench 11 is produced by means of a deep etching process. The etching process is anisotropic.

FIG. 2D shows the semiconductor body 10 during an ion implantation step. Doping atoms 28 are introduced into the substrate material 16 by means of ion implantation equipment, i.e., into an implantation region of the bottom 15, such that a doped region 29 is produced in the substrate material 16 underneath the bottom 15. The doping atoms 28 act as donors. Here, ion implantation into an implantation region of the bottom 15 means that implantation into all or part of the bottom is carried out as a function of the parameter selection for the operation of the ion implantation equipment.

In an alternative embodiment, the selected doping atoms 28 act as acceptors in the substrate material 16.

In an alternative embodiment of the method, the implantation step can be omitted. The doped region 29 is not shown in the other figures in order to provide a better overview.

Figure 2E:
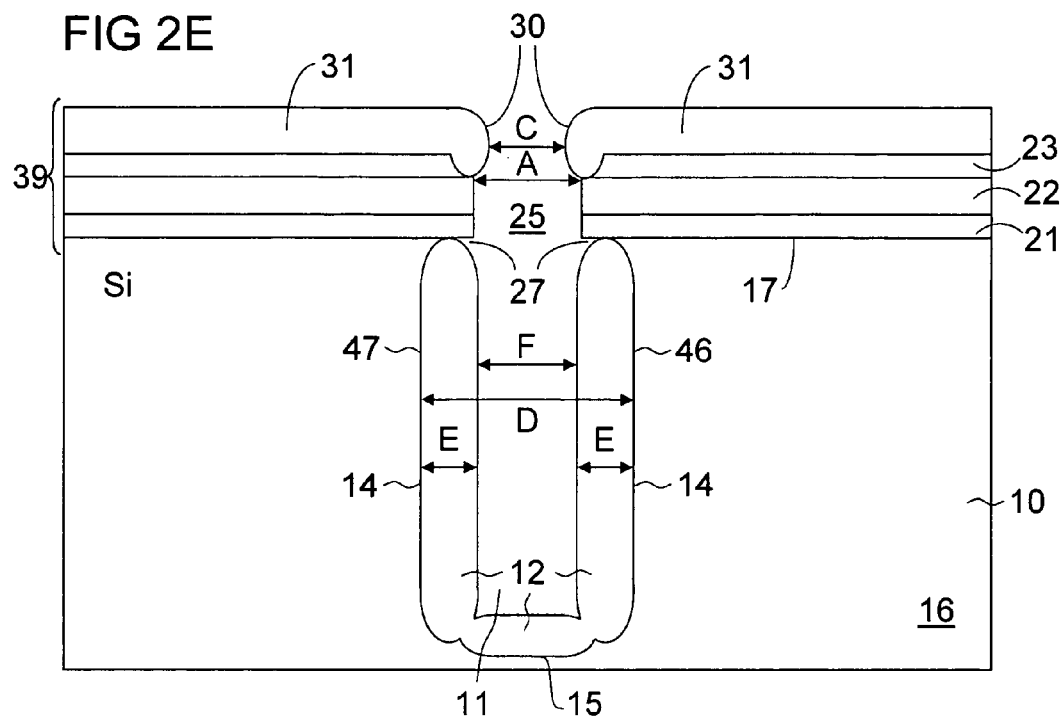

FIG. 2E shows the semiconductor body 10 after the removal of the photoresist 24 and after a thermal oxidation process. During the thermal oxidation process, the substrate material 16 of the semiconductor body 10 is oxidized on the side wall 14 and on the bottom 15 of the trench 11 such that the silicon oxide layer 12 is produced on the side wall 14 and the bottom 15. The boundary of the polysilicon layer 23 in the direction of the recess 25 is formed by an edge 30. The edge 30 is located on a boundary surface between the polysilicon layer 23 and the recess 25. An additional silicon oxide layer 31 is produced by oxidizing the polysilicon layer 23. Oxygen is also able to reach the edge 30. Consequently, the polysilicon layer 23 is oxidized not only on its surface, but also on the edge 30. The additional silicon oxide layer 31 being produced has larger dimensions than a portion of the polysilicon layer 23 converted during the oxidation process. Consequently, the width C of a recess in the additional silicon oxide layer 31 is smaller than the width A of the recess in the hard-mask oxide layer 21 and the nitride layer 22. Thus, the size of an opening for the subsequent etching step is reduced.

In contrast to larger molecules that are used, for example, in CVD processes, oxygen has a very high diffusion coefficient in atmosphere during the oxidation process such that a sufficient quantity of oxygen reaches the side wall 14 and the bottom 15. In addition, a very high homogeneity of the layer thickness of the silicon oxide layer 12 is achieved because the layer growth of the silicon oxide layer 12 during the oxidation process also is essentially limited by the diffusion of oxygen through the already formed silicon oxide layer 12 rather than the diffusion of oxygen from the atmosphere to the side wall 14 and to the bottom 15 during the oxidation process. Consequently, the layer thickness of the silicon oxide layer 12 near the first main surface 17 in the vicinity of the undercut 27 approximately corresponds to the layer thickness of the silicon oxide layer 12 at any other location of the side wall 14. The size of the recess in the substrate material 16 and therefore the trench 11 is increased by the thermal oxidation process. Thus, the width D of the recess of the substrate material 16 is greater than the width B of the recess in the trench 11 immediately after the trench 11 shown in FIG. 2C is etched. The thickness of the additional silicon oxide layer 31 may be more or less identical to the thickness of the silicon oxide layer 12 on the bottom 15.

The silicon oxide layer 12 advantageously grows laterally into the substrate material 16 of the semiconductor body 10 such that this growth into the substrate material protects the silicon oxide layer 12 on the side wall 14 during a subsequent etching process for removing the silicon oxide layer 12 on the bottom 15. In order to produce a silicon oxide layer 12 with a thickness E, a layer of the substrate material 16 on the side wall 14 with a thickness of approximately 0.44*E is consumed. The thermal oxidation for producing the silicon oxide layer 12 can be advantageously carried out during a diffusion step for producing a trough. It is advantageous to produce a silicon oxide layer 12 with a very low defect density. The silicon oxide layer 12 advantageously has very high purity. Due to the low defect density and the low density of impurities in the silicon oxide layer 12, the silicon oxide layer 12 has a very high dielectric strength relative to voltages. In one exemplary embodiment, the thickness E of the silicon oxide layer 12 may have a value in an interval of 300 nm to 400 nm. It is also advantageous that a high dielectric strength can already be achieved with such a small thickness E due to the high quality of the silicon oxide layer 12.

Figure 2F:
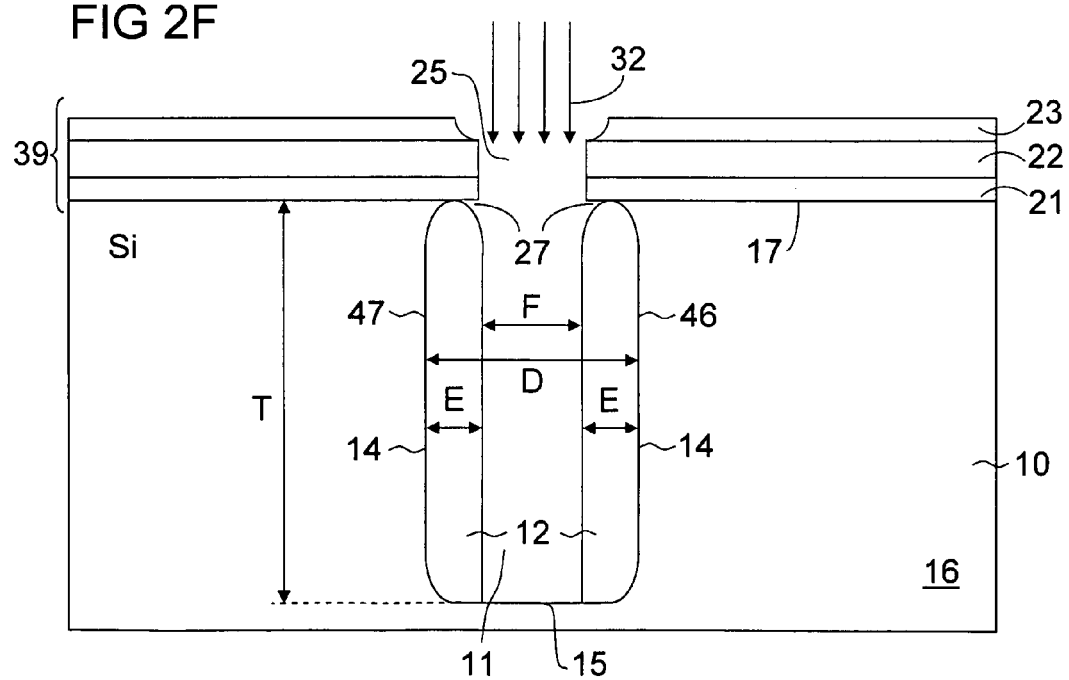

FIG. 2F shows the semiconductor body 10 at the end of an etching process of the silicon oxide layer 12. An anisotropic method is used for this etching process. Consequently, the etching process has a preferred direction 32. The preferred direction 32 of the etching process extends approximately perpendicularly to the first main surface 17. An additional etching mask arrangement 39 comprises the additional silicon oxide layer 31, the polysilicon layer 23, the nitride layer 22 and the hard-mask oxide layer 21. The additional etching mask arrangement is arranged above the first main surface 17. Due to the anisotropy of the etching process, the silicon oxide layer 12 on the bottom 15 is removed. The silicon oxide layer 12 on the side wall 14 remains unchanged and hardly affected. A reactive ion etching method, or RIE, is used as the etching process. Alternatively, a non-reactive ion beam etching method or ion milling or a reactive ion beam etching method, or RIBE, may be used. The additional silicon oxide layer 31 is removed during the etching process. Since this layer has the approximate thickness of the silicon oxide layer 12 on the bottom 15, the exposure of the remaining polysilicon layer 23 can serve as an indicator for controlling the etching time.

It is advantageous that the anisotropic etching process is used essentially to remove the silicon oxide layer 12 only on the bottom 15 but not on the side wall 14. The selective etching of the silicon oxide layer 12 on the bottom 15 but not the silicon oxide layer 12 on the side wall 14 is promoted by the undercut 27. The silicon oxide layer 12 on the side wall 14 is also protected due to the small width C of the recess in the additional silicon oxide layer 31 in comparison with the width A of the recess in the nitride layer 22 and the hard-mask oxide layer 21. It is furthermore advantageous that a stack of layers on the first main surface 17 that comprises the remaining polysilicon layer 23, the nitride layer 22 and the hard-mask oxide layer 21 is prevented from being acted upon by the additional silicon oxide layer 31. The remaining polysilicon layer 23 advantageously protects the underlying nitride layer 22.

In one embodiment, the following applies at beginning of the removal of the silicon oxide layer 12 on the bottom 15 of the trench 11:

$$C \leq D - 2*E,$$

where C is the width of the recess in the additional silicon oxide layer 31, D is the width of the recess of the substrate material 16 in the trench 11, and E is the thickness of the silicon oxide layer 12 on the side wall 14 of the trench 11. The opening in the additional etching mask arrangement 39 is therefore narrower than the recess in the trench 11.

Figure 2G:
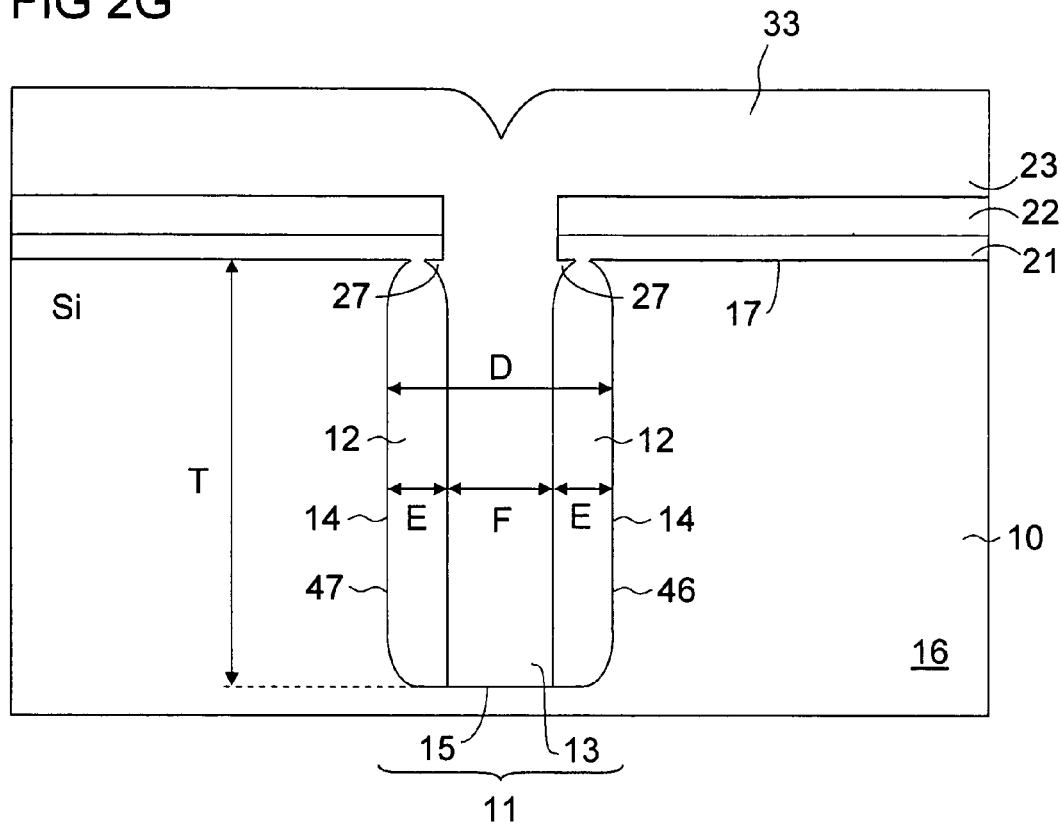

FIG. 2G shows the semiconductor body 10 after deposition of an additional polysilicon layer 33 on the polysilicon layer 23 and in the trench 11. The trench 11 is filled with polysilicon during the deposition process. Thus, the polysilicon body 13 in the trench 11 is produced during this deposition process. The polysilicon is doped with acceptors. In an alternative embodiment, the polysilicon is doped with donors.

Figure 2H:
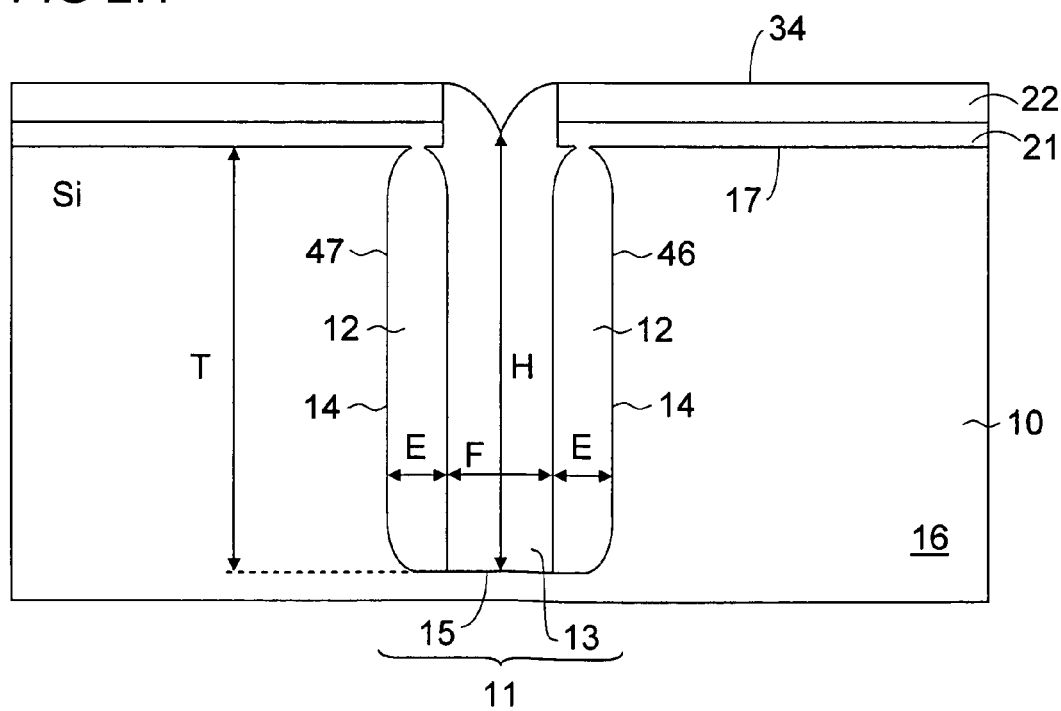

FIG. 2H shows the semiconductor body 10 after removal of the additional polysilicon layer 33 and the polysilicon layer 23 on a surface 34 of the semiconductor body 10. The etching process is stopped as soon as the nitride layer 22 is exposed. Thus, the polysilicon layer 13 in the trench 11 is not removed during this etching process. The height H of the polysilicon body 13 perpendicular to the first main surface 17 is therefore greater than the depth T of the trench 11. This is advantageous for producing an electrical connection of the polysilicon body 13.

FIG. 2I shows the semiconductor body 10 after removal of the nitride layer 22.

FIG. 2K shows the semiconductor body 10 after removal of the hard-mask oxide layer 21. Since the polysilicon layer 13 is not acted upon during the removal of the hard-mask oxide layer 21, it extends beyond the first main surface 17. Consequently, the substrate material 16, the silicon oxide layer 12 and the polysilicon body 13 are arranged on the first main surface 17 because the additional etching mask arrangement 39 is now removed.

FIG. 2L shows a semiconductor body 10 that corresponds to the semiconductor body shown in FIG. 1A, i.e., after oxidation. The first additional silicon oxide layer 18 and the second additional silicon oxide layer 19 that are located on the first main surface 17 on either side of the trench 11 are produced by means of the oxidation that is realized in the form of a field oxide layer. The first and second additional silicon oxide layers 18, 19 are therefore situated on the first main surface 17 adjacent to the polysilicon body 13. Prior to the field oxidation, a surface 37 of the polysilicon body 13 is protected with a not-shown additional nitride layer that serves to protect the polysilicon body 13. Since the polysilicon body 13 projects beyond the first main surface 17, it has a lateral surface on which the polysilicon body 13 is partially oxidized by means of the field oxidation. The oxide formed in this way is enclosed by the first and the second additional silicon oxide layer 18, 19. In addition, regions 35, 36 that are spaced apart from the trench 11 and located on the first main surface 17 are also covered with the additional nitride layer in order to prevent the first and the second additional silicon oxide layer 18, 19 from growing in the regions 35, 36. The field oxide layer is therefore effected by a method for the local oxidation of silicon, or LOCOS. Consequently, the first and the second additional silicon oxide layer 18, 19 contain portions of the polysilicon body 13 oxidized by means of the LOCOS method.

Figure 3A:
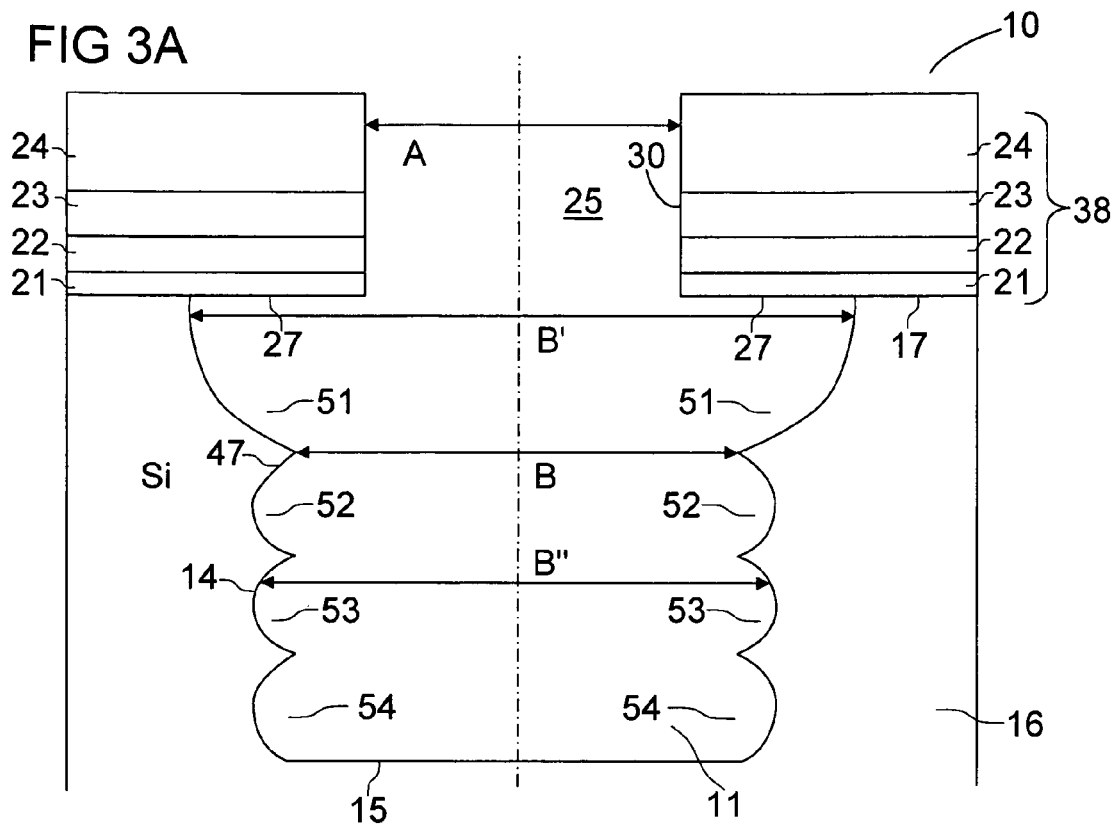
FIGS. 3A and 3B show an alternative embodiment of a method.

FIG. 3A shows an alternative embodiment of the cross section illustrated in FIG. 2C. The cross section illustrated in FIG. 3A can be produced in an alternative embodiment of the method. In FIG. 3A, the semiconductor body 10 comprises the etching mask arrangement 38 that features a recess 25. The etching mask arrangement 38 comprises the hard-mask oxide layer 21, the nitride layer 22, the polysilicon layer 23 and the photoresist 24. The trench 11 is produced by means of a deep etching process, during which two different gas compositions alternately act upon the semiconductor body 10. The first gas composition produces a polymer on the surface of the substrate, i.e., on the side wall 14 and the bottom 15 of the trench 11. The second gas composition serves for etching the substrate material 16. The polymer on the bottom 15 is removed by means of a sputtering process while the second gas composition is in the reactor chamber. The removal is effected by means of the physical stage of the deep etching process. The polymer on the side wall 14 is only slightly dissolved by the chemical stage of the process and therefore serves to protect the side wall 14 from being etched by the second gas composition.

The etching and deposition processes alternate cyclically. Since the first and second gas composition also act on the semiconductor body alternately, scallops 51 to 54 are produced in the side wall 14 of the trench 11 as shown in FIG. 3A. If the processing time for the first application of the second gas composition is chosen to be longer than the processing times for the other applications of the second gas composition in the subsequent cycles, it is possible to produce a first scallop 51, with dimensions parallel and perpendicular to the first main surface 17 that are greater than those of the other scallops 52 to 54. Consequently, a significant undercut 27 of the etching mask arrangement 38 is achieved by means of the first scallop 51. This means that the width B of the trench 11 is advantageously increased relative to the width A of the recess 25 of the etching mask arrangement 38. A width B' in the region of the first scallop 51 is greater than a width B" in the region of the other scallops 52 to 54.

The two above-mentioned gases can be $C_4F_4$ as the first gas and $SF_6$ as the second gas, and their use is described in the article "Modeling and Simulation of DRIE (Deep Reactive Ion Etch) Process", by Yunxia Guo et al., published at http://www.paper.edu.cn/download_feature_paper.php?serial_number=Aqilentqs2007B003. The content of this article is hereby incorporated by reference.

The scallops 51-54 are generated because the gas composition and, thus, the effects of the different gas compositions on the semiconductor substrate change periodically. An exemplary procedure could be:

Step 1: An etching gas composition which isotropically etches Silicon is introduced in the etching reactor. The composition comprises $SF_6$. The gas will etch silicon at the regions of the semiconductor body which are not covered by an etch mask. Since the gas performs an isotropic etching effect, a first cavity is generated, wherein the etch mask is underetched. Thus a first scallop is created.

Step 2: A deposition gas composition is introduced in the etching reactor which generates a polymer layer on top of the complete surface including the cavity. The composition comprises $C_4F_8$.

Step 3: The etching gas composition is introduced again. A gas of the etching gas composition performs an anisotropic etching. Thus, this gas removes the polymer at the bottom of the cavity. The sidewalls of the cavity are still covered by the polymer. The etching gas composition again etches silicon in all regions, where no etch mask such as the polymer layer exists. The silicon at the bottom of the cavity is removed, the polymer etch mask is underetched and, thus, a second cavity below the first cavity with a second scallop is generated.

Step 4 equals step 2, and so on.

Process engineers commonly try to reduce the scallops. Contrary to that, the above-mentioned first etching step (step 1) is performed such that a large underetching of the etch mask and, thus, a large first scallop is achieved.

In an alternative embodiment, the cyclic deep etching process begins with the application of the second gas composition, wherein the processing time for the first application of the second gas composition is adjusted to be longer than the processing times for the subsequent applications of the second gas composition.

The ion implantation step shown in FIG. 2D can then be carried out. The ion implantation step is not illustrated in the figures because it does not alter the geometry of the trench 11.

Figure 3B:
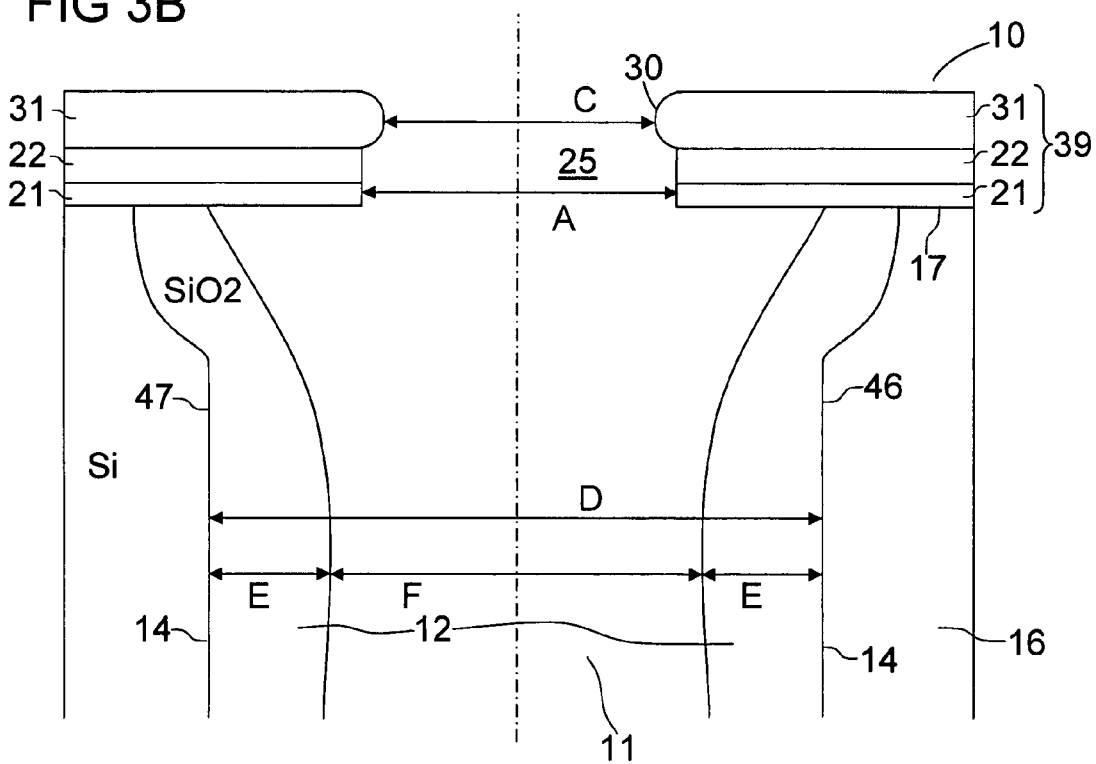

FIG. 3B shows a cross section through the semiconductor body 10 after removal of the photoresist and after the thermal oxidation of the structure illustrated in FIG. 3A is carried out. The detail shown in FIG. 3B therefore represents a variant of FIG. 2E. The thermal oxidation serves for oxidizing the substrate material 16 of the semiconductor body 10 on the side wall 14 such that the silicon oxide layer 12 is produced on the side wall 14. The unevenness on the side wall 14 shown in FIG. 3A is reduced by the thermal oxidation process. This is because the thermal oxidation starts at every point of the surface. During the oxidation, the oxygen diffuses through the silicon dioxide layer. Since the tips between the scallops are more exposed to oxygen, they are oxidized faster in comparison to another part of a scallop. The sidewall 14 which is the interface between silicon and silicon dioxide is smoothed with increasing oxidation time. The surface of the silicon dioxide is also smoothed during the oxidation process.

The additional silicon oxide layer 31 is produced during this process due to the oxidation of the polysilicon layer 23. The polysilicon layer 23 is also oxidized on the edge 30 within the recess 25. According to FIG. 3B, the polysilicon layer 23 is completely converted into the additional silicon oxide layer 31. Due to the oxidation of the polysilicon layer 23, the width C of the recess 25 is smaller than the width A of the recess in the oxide layer 21 and the nitride layer 22.

Due to the large magnitude of the undercut 27 produced by means of the first scallop 51, the width F of the recess between the two silicon oxide layers 12 on the side wall 14 is greater than or equal to the width C of the recess 25 in the additional etching mask arrangement 39. The undercut 27 provides the advantage that the silicon oxide layer 12 on the side wall 14 is only slightly, if at all, affected perpendicular to the surface 21 of the semiconductor body 10 by the physical stage of the etching process.

Due to the size reduction of the recess 25 with the aid of the additional silicon oxide layer 31, the protective effect of the additional etching mask arrangement 39 for the silicon oxide layer 12 on the side wall 14 is additionally improved. The method can be continued with the steps that were described with reference to FIGS. 2F to 2L.

In a not-shown alternative embodiment, the thickness of the polysilicon layer 23 and the duration for oxidizing the silicon oxide layer 12 are chosen such that the polysilicon layer 23 is not thoroughly oxidized. In order to produce an additional silicon oxide layer 31 with a thickness G, a polysilicon layer 23 with a thickness of approximately 0.43*G is consumed.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

We claim:

1. A method for manufacturing a semiconductor body with a trench, comprising the steps of:
    etching the trench in the semiconductor body by using an etching mask arrangement that features a polysilicon layer for etching the trench;
    forming a silicon oxide layer on at least one side wall of the trench and on a bottom of the trench by means of thermal oxidation;
    removing the silicon oxide layer on the bottom of the trench by using an additional etching mask arrangement having an additional silicon oxide layer produced from the polysilicon layer by means of thermal oxidation; and
    filling the trench with polysilicon in order to form a polysilicon body that is arranged directly on the silicon oxide layer and on a substrate material of the bottom.

2. The method according to claim 1, wherein the etching mask arrangement used for etching the trench includes at least one layer of the group that comprises a hard-mask oxide layer and a silicon nitride layer.

3. The method according to claim 2, wherein the etching mask arrangement includes the hard-mask oxide layer and the silicon nitride layer.

4. The method according to claim 2, wherein an undercut of the etching mask arrangement is produced during etching of the trench.

5. The method according to claim 1, wherein the trench is etched by means of a deep etching method, in which the semiconductor body is alternately acted upon by a first gas composition that serves to passivate one side wall of the trench with a polymer and with a second gas composition that serves to remove the substrate material.

6. The method according to claim 5, wherein the semiconductor body is initially acted upon by the second gas composition in order to achieve a higher width B' for the recess in a region of a first scallop of the trench than the value B" for the recess in a region of further scallops of the trench during the utilization of the second gas composition in the ensuing steps.

7. The method according to claim 1, wherein the polysilicon layer is at least partially oxidized during the production of the silicon oxide layer on the at least one side wall of the trench and on the bottom of the trench, and, therefore is at least partially converted into the additional silicon oxide layer.

8. The method according to claim 7, wherein the size of a recess in the additional etching mask arrangement is reduced in comparison to the size of a recess in the etching mask arrangement by the at least partial oxidation of the polysilicon layer during the production of the silicon oxide layer on the at least one side wall of the trench and on the bottom of the trench.

9. The method according to claim 1, wherein a layer of the group comprising the hard-mask oxide layer and the nitride layer in the etching mask arrangement is used for at least one of the layers of the additional etching mask arrangement.

10. The method according to claim 1, wherein the removal of the silicon oxide layer on the bottom of the trench is carried out by means of an anisotropic etching process.

11. The method according to claim 1, wherein the removal of the silicon oxide layer on the bottom of the trench is carried out by means of a reactive ion etching process or a reactive ion beam etching process or a non-reactive ion beam etching process.

12. The method according to claim 1, wherein the following applies at the beginning of the removal of the silicon oxide layer on the bottom of the trench:

$$C \leq D - 2*E,$$

where C is the width of the recess in the additional silicon oxide layer, D is the width of the recess of the substrate material in the trench and E is the thickness of the silicon oxide layer on the side wall of the trench.

13. The method according to claim 1, wherein ion implantation into the bottom of the trench is carried out after the etching of the trench.

14. A method for manufacturing a semiconductor body with a trench, comprising the steps of:
   etching the trench in the semiconductor body by using an etching mask arrangement that features a polysilicon layer for etching the trench;
   forming a silicon oxide layer on at least one side wall of the trench and on a bottom of the trench by thermal oxidation;
   removing the silicon oxide layer on the bottom of the trench by using an additional etching mask arrangement having an additional silicon oxide layer produced from the polysilicon layer by means of thermal oxidation; and
   filling the trench with polysilicon in order to form a polysilicon body that is arranged directly on the silicon oxide layer and on a substrate material of the bottom,
   wherein the polysilicon layer is at least partially oxidized during the production of the silicon oxide layer on the at least one side wall of the trench, and, therefore is at least partially converted into the additional silicon oxide layer, and
   wherein a size of a recess in the additional etching mask arrangement is reduced in comparison to a size of a recess in the etching mask arrangement by the at least partial oxidation of the polysilicon layer during the production of the silicon oxide layer on the at least one side wall of the trench and on the bottom of the trench.

15. A method for manufacturing a semiconductor body with a trench, comprising the steps of
   etching the trench in the semiconductor body by using an etching mask arrangement that features a polysilicon layer for etching the trench;
   forming a silicon oxide layer on at least one side wall of the trench and on a bottom of the trench by thermal oxidation;
   removing the silicon oxide layer on the bottom of the trench by using an additional etching mask arrangement having an additional silicon oxide layer produced from the polysilicon layer by thermal oxidation; and
   filling the trench with polysilicon in order to form a polysilicon body that is arranged directly on the silicon oxide layer and on a substrate material of the bottom,
   wherein an undercut of the etching mask arrangement is produced during etching of the trench, and
   wherein a width of a recess of the trench is greater than a width of a recess of the etching mask arrangement.

* * * * *